United States Patent [19]

Kamahara

[11] 4,374,393
[45] Feb. 15, 1983

[54] LIGHT TRIGGERED THYRISTOR DEVICE

[75] Inventor: Koichi Kamahara, Tokyo, Japan

[73] Assignee: Mitsubishi Denki Kabushiki Kaisha, Tokyo, Japan

[21] Appl. No.: 195,907

[22] Filed: Oct. 10, 1980

[30] Foreign Application Priority Data

Oct. 13, 1979 [JP] Japan .................................. 54-133916

[51] Int. Cl.³ ...................... H01L 27/14; H01L 29/74; H01L 23/16; H01L 39/02
[52] U.S. Cl. ......................................... 357/30; 357/38; 357/75; 357/80
[58] Field of Search ....................... 357/75, 76, 80, 30, 357/38

[56] References Cited

U.S. PATENT DOCUMENTS 4,207,587 6/1980 Hanes et al. ...................... 357/30 X
4,257,058 3/1981 Ferro et al. ...................... 357/300 R
4,313,128 1/1982 Schlegel et al. .................. 357/75 X

FOREIGN PATENT DOCUMENTS 54-133916 10/1979 Japan .

OTHER PUBLICATIONS

D. J. Page, "Light Triggered Thyristors for VAR Generator Applications", Seventh IEEE/PES Transmission and Distribution Conference and Exposition, (1979), pp. 222-226.
V. A. K. Temple, "Light Triggered Thyristors for HVDC Applications", Seventh IEEE/PES Transmission and Distribution Conference and Exposition, (1979), pp. 213-221.

Primary Examiner—Martin H. Edlow
Assistant Examiner—J. Carroll
Attorney, Agent, or Firm—C. L. Menzemer

[57] ABSTRACT

The present invention comprises a discrete main thyristor and a discrete auxiliary thyristor contained within a single case or package member. The auxiliary thyristor is triggered by a light signal passing through an aperture in a wall of the case member. The auxiliary thyristor in turn triggers the main thyristor.

3 Claims, 3 Drawing Figures

LIGHT TRIGGERED THYRISTOR DEVICE

BACKGROUND OF THE INVENTION

1. Field of the Invention

The present invention is in the field of light activated thyristors.

2. Description of the Prior Art

Light activated thyristors are known. In such prior art thyristors, the dv/dt and di/dt characteristics deteriorate when attempts are made to increase light triggering sensitivity of the device. Such deterioration severely limits the power handling capability of such light activated devices.

SUMMARY OF THE INVENTION

The present invention comprises a light triggered thyristor device comprising a main thyristor, an auxiliary thyristor capable of being triggered by a light signal incident on a light receptor area thereof, and a cylinder case, said case having side walls comprised of an electrically insulating material, said walls forming a hole through which a fiber optics cable is introduced into said case, said main thyristor being supported in said case by pressure contacts comprised of exterior anode and cathode electrodes, said auxiliary thyristor being fixed to an inside surface of said walls of said case with the light receptor area thereof placed in registry with an end portion of said fiber optics cable, anode electrodes of both of said thyristors being electrically interconnected, and a gate electrode of the main thyristor and a cathode electrode of the auxiliary thyristor being electrically interconnected.

DESCRIPTION OF THE DRAWINGS

For a better undersanding of the present invention reference should be had to the following detailed decription and drawings in which.

DESCRIPTION OF THE PREFERRED EMBODIMENT

Figure 1:
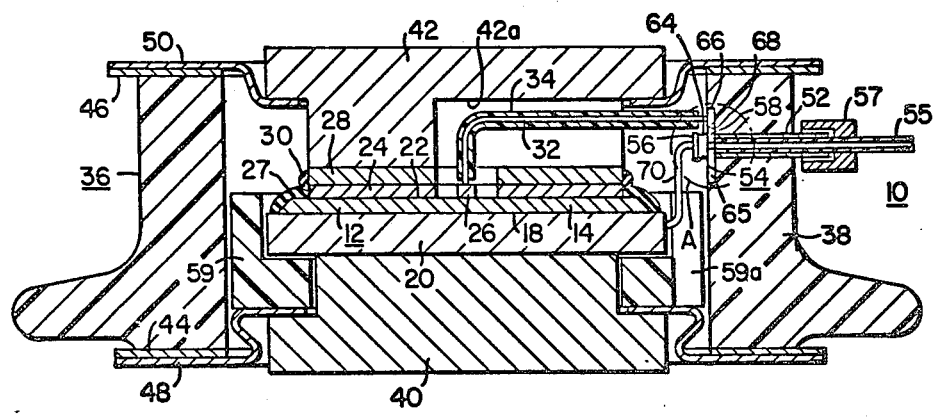
FIG. 1 is a sectional view of a light triggered thyristor device embodying the teachings of this invention.

With reference to FIG. 1 there is shown a light triggered or activated thyristor device 10 embodying the teachings of this invention.

The thyristor device 10 is comprised of a main thyristor 12 with a high withstanding voltage. The thyristor 12 is comprised of a silicon wafer 14. The wafer 14 has a pnpn structure and is formed by well known diffusion techniques.

On bottom surface 18 of wafer 14, in contact with the outside p-type region of thyristor 12, a molybdenum disk 20 is brazed to the wafer 14 and serves as the anode electrode of the thyristor 12. The brazing is preferably carried out in a vacuum at a temperature of from about 650° C. to 700° C.

On top surface 22 of wafer 14, in contact with the outside n-type region of thyristor 12, an aluminum layer 24 is vapor deposit to form a cathode electrode of the thyristor 12. The thickness of the layer may range from 12 μm to 16 μm. The aluminum layer 24 is subsequently sintered at a temperature of 560° C. to 570° C. in a nitrogen atmosphere.

A gate electrode 26 for thyristor 12 is also formed as a vapor deposited aluminum layer on the same surface, surface 22, of the thyristor 12 as the cathode electrode but at a point where the interior p-type region of the thyristor 12 is exposed.

The aluminum layer constituting the gate electrode 26 can be formed simultaneously with the cathode electrode using the same technique. That is to say, the gate and cathode electrodes 26 and 24 respectively, are separated from each other during vapor depositing of aluminum by a metal mask, or are separated by a photo-etching method using well known photoengraving technique.

The circumferential or edge portion of the wafer 14, extending between bottom surface 18 and top surface 22, constituting the main thyristor 12 is worked into a bevelled structure. The bevelled surface of the wafer 14 is formed by etching and a silicone varnish 27 or a silicone rubber is applied thereon for the passivation thereof.

A molybdenum annulus 28 is superimposed on the vapor deposited aluminum cathode electrode 24 of the thyristor 12 and is affixed thereto by a layer 30 of a silicone rubber which is applied to the circumferential portion while the annular molybdenum is pressed against the cathode electrode 24.

An electrical lead 32 covered by electrical insulation 34 is then soldered to the gate electrode 26.

The main thyristor 12 is then disposed within a package or case 36.

The package or case 36 is comprised of an electrically insulating cylinder 38 formed of, for example, an alumina ceramic; a copper anode electrode 40 and a copper cathode electrode 42 formed of oxygen free copper; thin metal plates 44, 46, 48 and 50 formed of an iron, nickel, cobalt alloy sold commercially under the Trade Name KOVAR and a metal pipe 52 also of the iron, nickel, cobalt alloy. The metallic members are brazed to the copper electrodes 40 and 42 with a silver solder.

The metal pipe 52 is brazed to an opening 53 formed in the side of case 38.

A fiber optic cable 55 is inserted in the metal pipe 52 from the outside of case 38 and is clamped in place by a metal clamp 57.

A guide ring 59 formed of silicone rubber for the determination of the positioning and the fixing of the main thyristor 12 in the interior of the case holds the main thyristor element by resilient force thereof, and has a dimension such that the circumferential portion thereof is pressed against the inner wall of the package 38 by the resilient force thereof. It should be noted that there is a slot 59A in the guide ring 59 to accommodate the lead 70.

There is also a slot 42A in the cathode electrode 42 to accommodate the lead 32.

An auxiliary thyristor 54 having a pnpn configuration is formed in another wafer of silicon.

Figure 2:
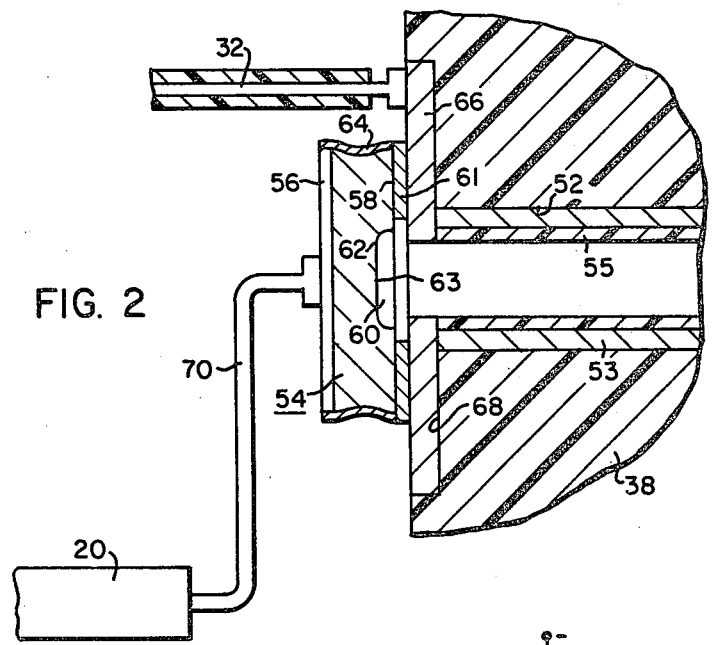
FIG. 2 is a detailed enlargement of that portion of FIG. 1 denoted by "A"

With additional reference to FIG. 2, after the pnpn structure is formed in the silicon chip constituting the auxiliary thyristor 54 by known diffusion techniques, a main surface 56 thereof at the anode side of the auxiliary thyristor 54 is electroplated with a nickel layer. Other main surface thereof 58 at the cathode side of the auxiliary thyristor 54 has exposed on the central area thereof the p-type base layer which functions as the light receptor portion 60 of the thyristor 54. A recess 63 is formed in the central area of said other main surface 58 of thyristor 54 by etching, in order to increase the light triggering sensitivity, and the surface of the recess 63 is protected by a transparent silicone varnish or glass layer 62. A cathode electrode 61 surrounds the light receptor portion 60 and the surfaces thereof are electroplated with a nickel layer, which makes the subsequent soldering process easier.

One end of the fiber optic cable 55 is abutted against the light receptor portion 60 and is in registry therewith.

Double bevelling 64 is effected on the circumferential surface of the auxiliary thyristor 54, as shown in FIG. 2. The bevelling is accomplished by removing the surface by etching as in the case of the main thyristor 12 and the silicone varnish or the silicone rubber is applied thereon for the purpose of passivation. A molybdenum annulus 66 is soldered to a recess 68 formed in the inner wall surface of the insulator cylinder 38 formed of ceramic. To effect this soldering process, the surface of the recess 68 has applied thereon a molybdenum-manganese layer, not shown, and the molybdenum annulus 66 has deposited thereon an electroplated nickel layer.

There is an electrical lead 70 electrically connecting anode 56 of thyristor 54 and anode electrode 20 of thyristor 12. The lead 32 electrically connects gate electrode 26 of thyristor 12 and the molybdenum annulus 66 of thyristor 54. The leads 32 and 70 are comprised of silver wires.

Although the gate electrode 26 of the main thyristor 12 is formed of a vapor deposited aluminum layer, a nickel layer, not shown, is further electroplated thereon to make the soldering process practicable. The anode electrode 20 of the main thyristor 12, the molybdenum disk, also has applied thereon a nickel layer by electroplating to make the soldering of the lead 70 to the disk practicable.

The lead 32 is covered by an electrically insulating tube preferably formed of a heat resistant fluorocarbon resin such as polytetrafluorethylene.

Figure 3:
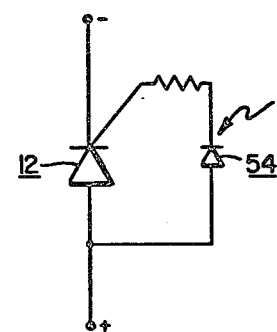
FIG. 3 is a schematic circuit diagram of the device of FIG. 1.

Thus, in the device constructed as described above, and with additional reference to FIG. 3, when a light signal of a suitable energy is introduced through the fiber optics cable 55 and radiated on the light receptor area 60 of the auxiliary thyristor 54 with positive and negative voltages applied on the anode and cathode copper electrodes 40 and 42 respectively, the auxiliary thyristor 54 is triggered first and the triggered current thereof flows to the gate electrode 26 of the main thyristor 12, so that the main thyristor 12 is subsequently triggered. Thus, the control of a high power supply is made possible. To explain in more concrete terms, when a first silicon wafer with a diameter of 85 mm and a second silicon wafer with a diameter of 7 mm are utilized as the main thyristor device with a withstand voltage of 4000 V and a mean on-state current of 1500 A can be triggered by a light input of 5 mW.

According to the present invention, the main thyristor 12 and the auxiliary thyristor 54 are combined so that the main thyristor 12 is triggered by the auxiliary thyristor 54 which in its turn is triggered by light, as described above. Therefore, the main thyristor can be made capable of controlling a high power of, for example, about 4000 V and 1500 A, using the conventional art. Further, as both thyristors are housed in one and the same package and constitute a single light triggered thyristor device 10.

The circuits in the package are quite compact and no insulation problem occurs between the two thyristors. Also, as the opening 53 in which the fiber optic cable 55 is introduced is completely blocked by the auxiliary thyristor 54 and the molybdenum disk 66 thereon, there is the advantage that the interior of the package can be completely hermetically sealed.

Further, as the fiber optics cable 55 corresponds to the light receptor portion 60 of the auxiliary thyristor 54 and is introduced in a straight line, the transmission loss of the light energy input is minimized, and a mean on-state current of about 1 A is sufficient for the auxiliary thyristor 54 and the main thyristor 12 to be fully triggered. The junction temperature Tj of the auxiliary thyristor can be limited to around 80° C. and the decrease in dv/dt or di/dt withstand values can be prevented.

I claim as my invention:

1. A light triggered thyristor device comprising a mean thyristor, an auxiliary thyristor capable of being triggered by a light signal incident on a light receptor area thereof, and an electrically insulating hermetically sealed cylinder case, said case having side walls forming a hole through which a fiber optics cable is introduced into said case, said main thyristor being supported in said case by a pressure contact of exterior anode and cathode electrodes, said auxiliary thyristor being fixed to said walls of said case with the light receptor area thereof placed in registry with an end portion of said fiber optics cable, anode electrodes of both of said thyristors being electrically interconnected, and a gate electrode of the main thyristor and a cathode electrode of the auxiliary thyristor being electrically interconnected.

2. The device of claim 1 in which the walls of said case are comprised of a ceramic material.

3. A light triggered semiconductor device comprising, a discrete main thyristor, said discrete main thyristor having an anode electrode, a cathode electrode and a gate electrode affixed to predetermined areas of said main thyristor, a discrete auxiliary thyristor, said auxiliary thyristor having an anode electrode and a cathode electrode affixed to predetermined areas of said auxiliary thyristor, a hermetically sealed case member, said case member having a cylindrical shape, side walls of said cylindrical case being comprised of an electrically insulating material, end members of said case being comprised of an electrically conductive metal, said main thyristor disposed within said case, said main thyristor being spaced apart from the said side walls of said case by an electrically insulating guide ring, one end member of said case member being in ohmic electrical contact with the cathode electrode of said main thyristor, said end members serving as anode and cathode contacts of said light triggered semiconductor device, the side walls of said case having a hole therein, said hole extending entirely through said wall, said auxiliary thyristor affixed to said wall of said case within said case, said auxiliary thyristor having a light receptor area being disposed over said hole in said wall, a fiber optic cable disposed within said hole, one end of said fiber optic cable in registry with said light receptor area of said auxiliary thyristor, another end of said fiber optic cable extending outside of said case adapted to receive a light signal, the anode electrodes of said main and said auxiliary thyristors being electrically ohmically connected within said case and the gate electrode of said main thyristor and the cathode electrode of said auxiliary thyristor being electrically ohmically connected within said case.

* * * * *